United States Patent
Hanley et al.

(10) Patent No.: US 11,818,518 B2
(45) Date of Patent: Nov. 14, 2023

(54) METHODS AND EQUIPMENT FOR REDUCING POWER LOSS IN CELLULAR SYSTEMS

(71) Applicant: CommScope Technologies LLC, Hickory, NC (US)

(72) Inventors: John Thomas Hanley, Orland Park, IL (US); Charles John Mann, Omaha, NE (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 16/863,339

(22) Filed: Apr. 30, 2020

(65) Prior Publication Data

US 2020/0351574 A1 Nov. 5, 2020

Related U.S. Application Data

(60) Provisional application No. 62/841,322, filed on May 1, 2019.

(51) Int. Cl.
*H04Q 1/28* (2006.01)
*H05K 7/14* (2006.01)
*H04W 88/08* (2009.01)

(52) U.S. Cl.
CPC .............. *H04Q 1/28* (2013.01); *H05K 7/14* (2013.01); *H04W 88/08* (2013.01)

(58) Field of Classification Search
CPC ............ H04Q 1/28; H05K 7/14; H04W 88/08
See application file for complete search history.

(56) References Cited

U.S. PATENT DOCUMENTS

| 3,659,189 A | 4/1972 | Kiviranna |
| 4,745,562 A | 5/1988 | Prazdny |
| 5,073,977 A | 12/1991 | Kawahata |
| 5,548,813 A | 8/1996 | Charas et al. |
| 5,610,793 A | 3/1997 | Luu |
| 6,095,867 A | 8/2000 | Brandt et al. |

(Continued)

FOREIGN PATENT DOCUMENTS

| CA | 2836133 | 11/2012 |
| CN | 101848004 | 9/2010 |

(Continued)

OTHER PUBLICATIONS

Chinese Office Action corresponding to Chinese Patent Application No. 201680006621.8, dated Mar. 4, 2019.

(Continued)

*Primary Examiner* — Junpeng Chen
(74) *Attorney, Agent, or Firm* — Fogg & Powers LLC

(57) ABSTRACT

Aspects of the present disclosure provide systems and devices for providing power to one or more remote radio heads used in telecommunications. Some aspects provide a power supply system comprising a first power supply and a plurality of second power supplies configured to be installed in a rack shelf. Each of the plurality of second power supplies is configured to receive a first power signal from the first power supply and provide a second power signal to a respective remote radio head from a plurality of remote radio heads, and at least first inputs to each of the plurality of second power supplies may be ganged together.

19 Claims, 14 Drawing Sheets

(56) References Cited

U.S. PATENT DOCUMENTS

| | | |
|---|---|---|
| 6,188,566 B1 | 2/2001 | Aoyama |
| 6,640,111 B1 | 10/2003 | Shapira |
| 6,813,510 B1 | 11/2004 | Kunzinger |
| 7,027,290 B1 | 4/2006 | Thrap |
| 7,460,381 B2 | 12/2008 | Lanni |
| 7,508,687 B2 | 3/2009 | Manolescu |
| 7,739,522 B2 | 6/2010 | Festoe et al. |
| RE41,655 E | 9/2010 | Woodhead et al. |
| 7,894,782 B2 | 2/2011 | Rofougaran |
| 7,949,315 B2 | 5/2011 | Rofougaran |
| 8,090,379 B2 | 1/2012 | Lambert et al. |
| 8,401,497 B2 | 3/2013 | Rofougaran |
| 8,401,501 B2 | 3/2013 | Rofougaran |
| 8,412,385 B2 | 4/2013 | Brumett, Jr. et al. |
| 8,520,549 B2 | 8/2013 | Rofougaran |
| 8,521,100 B2 | 8/2013 | Rofougaran |
| 8,526,893 B2 | 9/2013 | Rofougaran |
| 8,547,164 B2 | 10/2013 | Flores et al. |
| 8,566,627 B2 | 10/2013 | Halepete et al. |
| 8,577,359 B2 | 11/2013 | Wesby |
| 8,600,318 B2 | 12/2013 | Rofougaran |
| 8,730,639 B1 | 5/2014 | Wilson et al. |
| 8,754,622 B2 | 6/2014 | Dobkin et al. |
| 8,848,766 B2 | 9/2014 | Lemson et al. |
| 9,320,166 B1* | 4/2016 | Marr .................. G06F 1/263 |
| 9,374,179 B2 | 6/2016 | Wigren |
| 9,377,794 B1 | 6/2016 | Dwelley et al. |
| 9,488,997 B1 | 11/2016 | Dwelley et al. |
| 9,510,208 B2 | 11/2016 | Wei et al. |
| 9,964,722 B2 | 5/2018 | Chamberlain et al. |
| 10,812,664 B2* | 10/2020 | Kostakis .............. G05F 1/465 |
| 2003/0085621 A1 | 5/2003 | Potega |
| 2004/0121807 A1 | 6/2004 | Delbreil et al. |
| 2004/0223346 A1 | 11/2004 | Rayner et al. |
| 2006/0164108 A1 | 7/2006 | Herbold |
| 2007/0024372 A1 | 2/2007 | Hagen |
| 2007/0093204 A1 | 4/2007 | Kincard |
| 2007/0263675 A1 | 11/2007 | Lum et al. |
| 2008/0010474 A1 | 1/2008 | Chapuis |
| 2008/0172564 A1 | 7/2008 | Diab et al. |
| 2008/0272654 A1 | 11/2008 | Lontka |
| 2008/0300003 A1 | 12/2008 | Jeck et al. |
| 2009/0215492 A1 | 8/2009 | Pistner et al. |
| 2010/0181840 A1 | 7/2010 | Coulson et al. |
| 2010/0237948 A1 | 9/2010 | Nguyen et al. |
| 2010/0290787 A1 | 11/2010 | Cox |
| 2011/0053632 A1 | 3/2011 | Liu |
| 2011/0101937 A1 | 5/2011 | Dobkin et al. |
| 2011/0133560 A1* | 6/2011 | Yamashita ............ G06F 1/30 307/66 |
| 2011/0159877 A1 | 6/2011 | Kenington et al. |
| 2011/0237299 A1 | 9/2011 | Boss et al. |
| 2012/0069882 A1 | 3/2012 | Nino et al. |
| 2012/0155120 A1 | 6/2012 | Sugawara |
| 2012/0269509 A1 | 10/2012 | Hultermans |
| 2012/0317426 A1 | 12/2012 | Hunter, Jr. et al. |
| 2013/0051440 A1 | 2/2013 | Rofougaran |
| 2013/0108227 A1 | 5/2013 | Conner |
| 2013/0215804 A1 | 8/2013 | Lu et al. |
| 2013/0260702 A1 | 10/2013 | Kenington |
| 2013/0342949 A1 | 12/2013 | Xiong et al. |
| 2014/0055898 A1 | 2/2014 | Kostakis et al. |
| 2014/0168842 A1 | 6/2014 | Martinez et al. |
| 2014/0204496 A1 | 7/2014 | Martinez Sanchez et al. |
| 2014/0204497 A1 | 7/2014 | Martinez Sanchez et al. |
| 2014/0372258 A1 | 12/2014 | Elberbaum |
| 2015/0006095 A1 | 1/2015 | Voisine |
| 2015/0015078 A1 | 1/2015 | Kim |
| 2015/0080055 A1 | 3/2015 | Smentek et al. |
| 2015/0089253 A1 | 3/2015 | Doering et al. |
| 2015/0090487 A1 | 4/2015 | Efraimsson |
| 2015/0097518 A1 | 4/2015 | Bishop et al. |
| 2015/0168974 A1 | 6/2015 | Mascarenhas et al. |
| 2015/0234399 A1* | 8/2015 | Chamberlain ......... G01R 27/16 455/561 |
| 2015/0326317 A1 | 11/2015 | Michaelis et al. |
| 2016/0191164 A1 | 6/2016 | Kim et al. |
| 2016/0342168 A1 | 11/2016 | Chamberlain et al. |
| 2017/0094718 A1* | 3/2017 | Chamberlain ...... H04M 19/005 |
| 2017/0179817 A1 | 6/2017 | Gu |
| 2018/0164355 A1 | 6/2018 | Winkler et al. |
| 2018/0213091 A1* | 7/2018 | Kostakis .............. G05F 1/468 |

FOREIGN PATENT DOCUMENTS

| | | |
|---|---|---|
| CN | 102439835 A | 5/2012 |
| CN | 102752885 A | 10/2012 |
| CN | 104335294 | 2/2015 |
| JP | 6-163330 | 6/1994 |
| KR | 10-2010-0048227 | 5/2010 |
| KR | 10-2010-0069332 | 6/2010 |
| KR | 10-2011-0024543 | 3/2011 |
| KR | 20-2015-0004661 | 12/2015 |
| WO | 2012/083746 | 6/2012 |
| WO | 2012/159358 | 11/2012 |
| WO | 2013/147332 | 10/2013 |
| WO | 2015042023 | 3/2015 |

OTHER PUBLICATIONS

European Office Action corresponding to European Patent Application No. 15748741.4; dated Jun. 27, 2019, 5 pages.
Extended European Search Report Corresponding to International Application No. EP 15748714-1875; dated Jul. 6, 2017; 7 pages.
Extended Supplementary European Search Report, corresponding to European Application No. 16749587.8-1202, dated Aug. 30, 2018.
GE Product Data Sheet, CP2000DC54-PE Compact Power Line DC/DC Converter, Aug. 20, 2013, www.ge.com/powerelectronics, 15 pages.
International Search Report and Written Opinion Corresponding to International Application No. PCT/US2014/055800; dated Dec. 18, 2014; 14 Pages.
International Search Report and Written Opinion corresponding to International Application No. PCT/US2014/055800; dated Sep. 17, 2015; 7 pages.
Invitation to Pay Additional Fees and, Where Applicable, Protest Fees, PCT/US2016/022575, Jun. 23, 2016, 7 pages.
Jim Williams et al., "2-Wire Virtual Remote Sensing for Voltage Regulators—Clairvoyance Marries Remote Sensing," Linear Technology Brochure, Application Note 126, Oct. 2010, www.linear.com, pp. AN126-1-AN126-22.
Keithley Product Sheet, Single-Channel Programmable DC Power Supplies, Series 2200, undated, www.keithley.com, 4 pages, Admitted Prior Art.
Notification Concerning Transmittal of International Preliminary Report on Patentability Corresponding to International Application No. PCT/US2016/015085; dated Aug. 24, 2017; 10 Pages.
Notification Concerning Transmittal of International Preliminary Report on Patentability to corresponding Application No. PCT/2015/013740, dated Sep. 1, 2016, 14 pages.
Notification Concerning Transmittal of International Preliminary Report on Patentability, for corresponding application PCT/US2016/022575, dated Nov. 16, 2017, 9 pgs.
Notification of Transmittal of International Search Report and the Written Opinion of the International Searching Authority, or the Declaration Corresponding to International Application No. PCT/US2016/015085; dated May 12, 2016; 14 Pages.
Notification of Transmittal of the International Search Report and the Written Opinion of the International Searching Authority, or the Declaration for corresponding Application No. PCT/US2016/022575, dated Aug. 17, 2016, 14 pages.
Notification of Transmittal of the International Search Report and the Written Opinion of the International Searching Authority, or the Declaration, for corresponding application PCT/US2018/017276, dated May 28, 2018, 16 pages.
Office Action corresponding to Chinese Application No. 201480051376.3 dated Dec. 11, 2017, (English translation, 15 pages).

(56) References Cited

OTHER PUBLICATIONS

Office Action corresponding to Chinese Application No. 201580007901.6, dated Nov. 27, 2017.
International Search Report and the Written Opinion of the International Searching Authority corresponding to International Patent Application No. PCT/2020/030653 (12 pages) (dated Aug. 18, 2020).
"Extended European Search Report corresponding to European Application No. 18747190.9 dated Dec. 11, 2020".
European Patent Office, "Extended European Search Report", from EP Application No. 20798135.8 from Foreign Counterpart to U.S. Appl. No. 16/863,339, dated Mar. 7, 2023, pp. 1 through 6, Published: EP.

* cited by examiner

METHODS AND EQUIPMENT FOR REDUCING POWER LOSS IN CELLULAR SYSTEMS

CROSS-REFERENCE TO RELATED APPLICATION

The present application claims priority to U.S. Provisional Application No. 62/841,322, filed on May 1, 2019, with the United States Patent and Trademark Office, the entire contents of which are incorporated by reference herein for all purposes.

TECHNICAL FIELD

Aspects of the present disclosure relate generally to cellular communications systems and, more particularly, to cellular communications power supply systems.

BACKGROUND

Cellular base stations typically include, among other things, a radio, a baseband unit, and one or more antennas. The radio receives digital information and control signals from the baseband unit and modulates this information into a radio frequency ("RF") signal that is transmitted through the antennas. The radio also receives RF signals from the antenna and demodulates these signals and supplies them to the baseband unit. The baseband unit processes demodulated signals received from the radio into a format suitable for transmission over a backhaul communications system. The baseband unit also processes signals received from the backhaul communications system and supplies the processed signals to the radio. A power supply may also be provided that generates suitable direct current ("DC") power signals for powering the baseband unit and the radio. For example, the radio is often powered by a (nominal) 48 Volt DC power supply in cellular systems that are currently in use today. Typically, this is provided as a negative supply voltage (e.g., −48 VDC) and a ground (e.g., 0V) return voltage. A battery backup is also typically provided to maintain service for a limited period of time during power outages.

In order to increase coverage and signal quality, the antennas in many cellular base stations are located at the top of an antenna tower, which may be, for example, about fifty to two hundred feet tall. Antennas are also routinely mounted on other elevated structures such as, for example, buildings, utility poles and the like. Until fairly recently, the power supply, baseband unit and radio were all located in an equipment enclosure at the bottom of the antenna tower or other elevated structure to provide easy access for maintenance, repair and/or later upgrades to the equipment. Coaxial cable(s) were routed from the equipment enclosure to the top of the antenna tower and were used to carry RF signals between the radios and the antennas. However, in recent years, a shift has occurred and the radio is now more typically located at the top of the tower in new or upgraded cellular installations. Radios that are located at the top of the tower are typically referred to as remote radio heads ("RRH").

Using remote radio heads may significantly improve the quality of the cellular data signals that are transmitted and received by the cellular base station, as the use of remote radio heads may reduce signal transmission losses and noise. In particular, as the coaxial cables that connect radios that are located at the base of an antenna tower to antennas that are mounted near the top of the antenna tower may have lengths of 100-200 feet or more, the signal loss that occurs in transmitting signals at cellular frequencies (e.g., 1.8 GHz, 3.0 GHz, etc.) over these coaxial cables may be significant, as at these frequencies the coaxial cables tend to radiate RF signal energy. Because of this loss in signal power, the signal-to-noise ratio of the RF signals may be degraded in systems that locate the radio at the bottom of the antenna tower as compared to cellular base stations having remote radio heads that are located at the top of the tower next to the antennas (note that signal losses in the cabling connection between the baseband unit at the bottom of the tower and the remote radio head at the top of the tower may be much smaller, as these signals are transmitted at baseband or intermediate frequencies as opposed to RF frequencies, and because these signals may be transmitted up the antenna tower over fiber optic cables, which may exhibit lower losses).

FIG. 1 is a schematic diagram that illustrates a cellular base station 10' that utilizes remote radio heads. As shown in FIG. 1, the baseband unit 22 and the power supply 26 may be located at the bottom of the tower 30 in the equipment enclosure 20. The baseband unit 22 may be in communication with a backhaul communications system 44. A remote radio head 24 is located at the top of the tower 30 immediately adjacent to an antenna 32 (which may be a sectorized antenna). While the use of tower-mounted remote radio heads 24 may improve signal quality, it also, unfortunately, requires that DC power be delivered to the top of the tower 30 to power the remote radio head 24'. As shown in FIG. 1, typically a fiber optic cable 38 connects the baseband unit 22 to the remote radio head 24 (as fiber optic links may provide greater bandwidth and lower loss transmissions), and a separate or combined ("composite") power cable 36 is provided for delivering the DC power signal to the remote radio head 24. The separate power cable 36 is typically bundled with the fiber optic cable 38 so that they may be routed up the tower 30 together in a hybrid fiber optic/power trunk cable 40, although in some embodiments the power cable 36 and the fiber optic cable 38 may be routed separately up the tower 30. Trunk cables 40 typically have junction enclosures on either end thereof, and a first set of data and power jumper cables are used to connect the junction enclosure on the ground end of the trunk cable 40 to the baseband unit(s) 22 and power supply 26, and a second set of data and power (or combined data/power) jumper cables are used to connect the junction enclosure at the top of the tower 30 to the remote radio head 24.

Another change that has occurred in the cellular industry is a rapid increase in the number of subscribers as well as a dramatic increase in the amount of voice and data traffic transmitted and received by a typical subscriber. In response to this change, the number of remote radio heads 24 and antennas 32 that are being mounted on a typical antenna tower 30 has also increased, with twelve remote radio heads 24 and twelve or more antennas 32 being a common configuration today. Additionally, higher power remote radio heads 24 are also being used. These changes may result in increased weight and wind loading on the antenna towers 30 and the need for larger, more expensive trunk cables 40 and/or power cables 36.

SUMMARY

Some aspects of the present disclosure provide a power supply system. The power supply system may include a first power supply; and may include a plurality of second power supplies configured to be installed in a rack shelf. Each of the plurality of second power supplies may be configured to receive a first power signal from the first power supply and provide a second power signal to a respective remote radio head from a plurality of remote radio heads. At least first inputs to each of the plurality of second power supplies may be ganged together.

In some aspects, the one or more second power supplies may comprise a plurality of second power supplies, and the power supply system may include a module having a housing that comprises the second power supplies. The module may be configured to be installed in a rack. In some aspects, the module may include a plurality of output breakers, with ones of the plurality of output breakers electrically coupled between each second power supply and the respective remote radio head. The output breakers may be controlled by a controller configured to receive input via an input located on a front panel of the rack shelf.

In some aspects, the first inputs to each of the plurality of second power supplies may be ganged together by a removable bar, and wherein removal of the bar results in each of the second power supplies being independently electrically coupled to the first power supply.

In some aspects, each second power supply may include a surge protection device or overvoltage protection device. Each surge protection device or overvoltage protection device may be configured to protect a component within the respective second power supply from an overvoltage on an output from the second power supply.

In some aspects, the at least first inputs of each of the plurality of second power supplies may be provided on a front surface of a panel on the rack shelf. In some aspects, outputs from each of the plurality of second power supplies may be provided on the front surface of a panel of the rack shelf.

In some aspects, the first power signal may be the same as the second power signal.

In some aspects, each of the plurality of second power supplies may be configured to adjust a voltage level of the second power signal such that a voltage at a radio end of a cabling connection between the second power supply and the respective remote radio head is substantially constant notwithstanding variation in a current level of the second power signal.

In some aspects, the power supply system may include an input breaker electrically coupled between the first power supply and the plurality of second power supplies.

In some aspects, the first power supply may be installed at a first location in a rack, and the rack shelf may be installed at a second location in the rack below the first location. The plurality of second power supplies may be electrically coupled to the first power supply via a busbar or busbar extension.

Some aspects of the present disclosure provide a telecommunication system that includes a plurality of remote radio heads, and a power supply system. The power supply system may include a first power supply, and may include a plurality of second power supplies configured to be installed in a rack shelf. Each of the plurality of second power supplies may be configured to receive a first power signal from the first power supply and provide a second power signal to a respective remote radio head from the plurality of remote radio heads. At least first inputs to each of the plurality of second power supplies may be ganged together.

DETAILED DESCRIPTION

Methods, systems, and devices with improved power supply circuits that allow for reducing the power loss associated with delivering the DC power signal from the power supply at the base of a tower of the cellular base station to the remote radio head at the top of the tower are of value to operators of telecommunications equipment. Since cellular towers may be hundreds of feet tall and the voltage and currents required to power each remote radio head may be quite high (e.g., about 50 Volts at about 20 Amperes of current), the power loss that may occur along the hundreds of feet of cabling may be significant, and reduction of such power loss may result in significant power savings, thus reducing the costs of operating a cellular base station. Additionally, since the cellular base stations with improved power supply circuits may use less power, such cellular base stations may require fewer back-up batteries while maintaining operation for the same period of time during a power outage. This reduction in the amount of back-up batteries may represent a significant additional cost savings.

Figure 1:
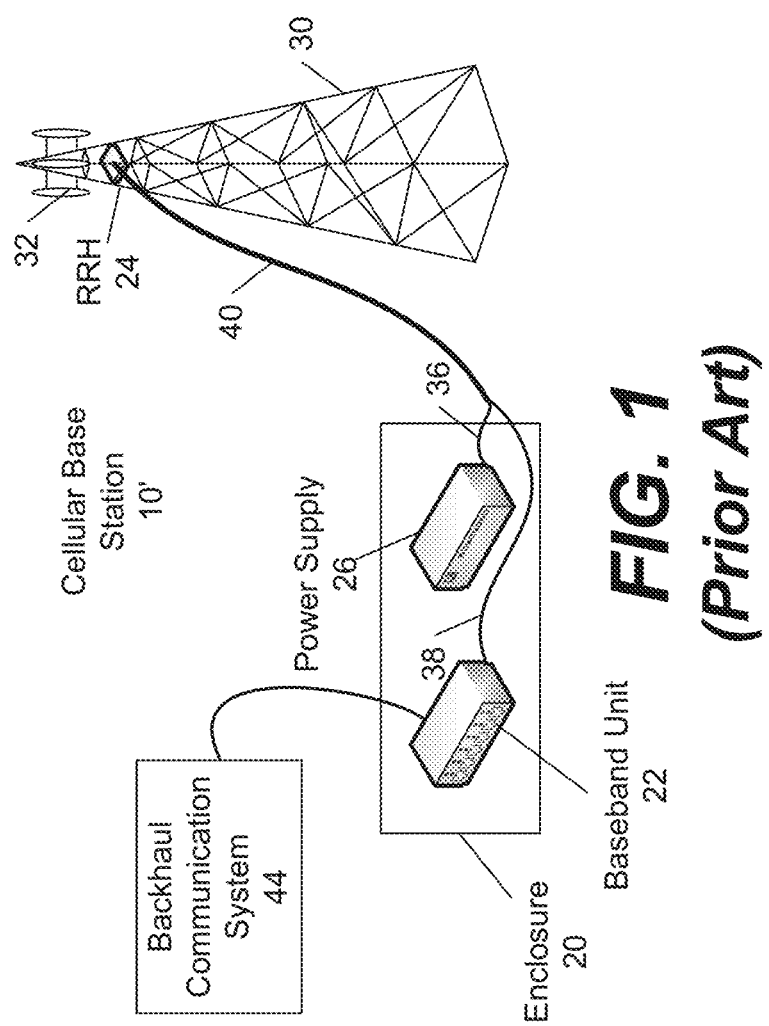
FIG. 1 is a simplified, schematic view of a cellular base station architecture that utilizes one or more remote radio heads and a conventional power supply system.
Figure 2:
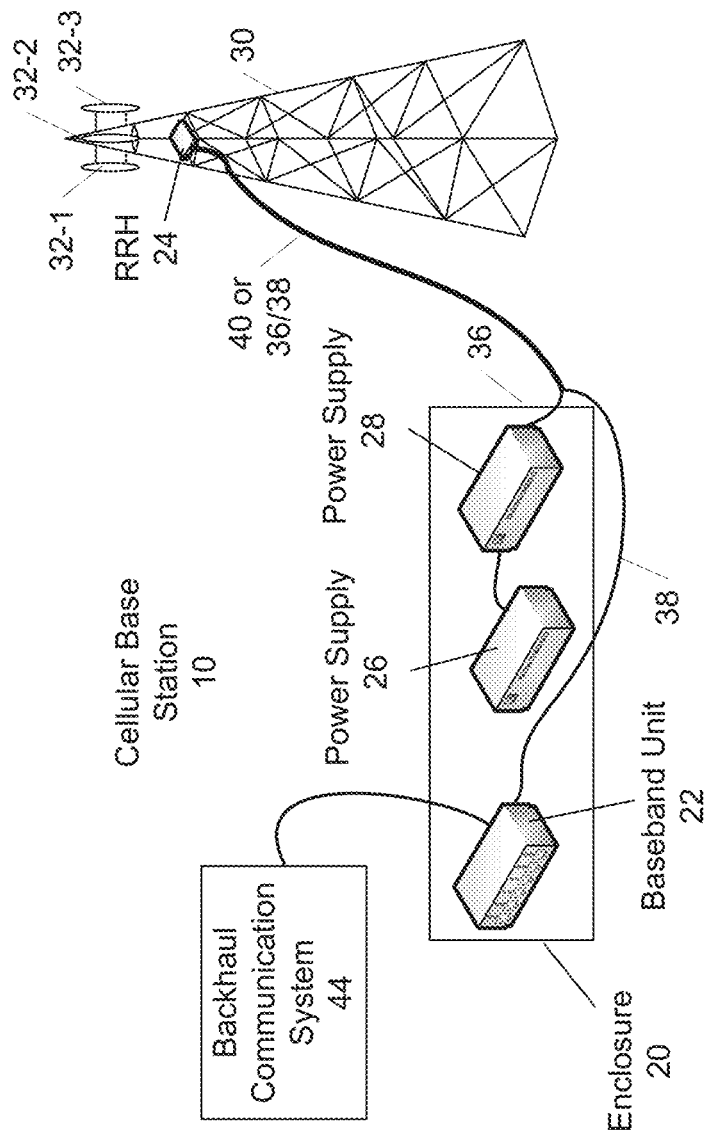
FIG. 2 is a simplified, schematic view of a cellular base station architecture that utilizes one or more remote radio heads and a power supply system that reduces the power loss associated with delivering the power signal to the remote radio heads.

FIG. 2 is a simplified, schematic view of a cellular base station 10 that utilizes one or more remote radio heads and a power supply system that reduces the power loss associated with delivering the power signal to the remote radio heads. As shown in FIG. 2, the cellular base station 10 includes an equipment enclosure 20 and a tower 30. The tower 30 may be a conventional antenna or cellular tower or may be another structure such as a utility pole or the like. A baseband unit 22, a first power supply 26 and a second power supply 28 are located within the equipment enclosure 20. An RRH 24 and plurality of antennas 32 (e.g., three sectorized antennas 32-1, 32-2, 32-3) are mounted on the tower 30, typically near the top thereof.

The RRH 24 receives digital information and control signals from the baseband unit 22 over a fiber optic cable 38 that is routed from the enclosure 20 to the top of the tower 30. The RRH 24 modulates this information into a radio frequency ("RF") signal at the appropriate cellular frequency that is then transmitted through one or more of the antennas 32. The RRH 24 also receives RF signals from one or more of the antennas 32, demodulates these signals, and supplies the demodulated signals to the baseband unit 22 over the fiber optic cable 38. The baseband unit 22 processes the demodulated signals received from the RRH 24 and forwards the processed signals to the backhaul communications system 44. The baseband unit 22 also processes signals received from the backhaul communications system 44 and supplies them to the RRH 24. Typically, the baseband unit 22 and the RRHs 24 each include optical-to-electrical and electrical-to-optical converters that couple the digital information and control signals to and from the fiber optic cable 38.

The first power supply 26 generates one or more direct current ("DC") power signals. For example, the first power supply 26 may generate one or more DC power signals from an alternating current input signal and/or from one or more batteries. The second power supply 28 in the cellular base station 10 of FIG. 2 may comprise a DC-to-DC converter that accepts the DC power signal output by the first power supply 26 as an input and outputs a DC power signal having a different voltage. A power cable 36 may be connected to the output of the second power supply 28 and is bundled together with the fiber optic cable 38 so that the two cables 36, 38 may be routed up the tower 30 as an integral unit. While the first power supply 26 and the second power supply 28 are illustrated as separate power supply units in the cellular base station 10 of FIG. 2, it will be appreciated that the two power supplies 26, 28 may be combined into a single power supply unit in other embodiments.

State-of-the-art RRHs are most typically designed to be powered by a 48 Volt (nominal) DC power signal. This is typically supplied as negative voltage over a supply conductor, that is, a −48 VDC voltage, with the return conductor at ground or 0V. While the minimum DC power signal voltage at which the RRH 24 will operate and the maximum DC power signal voltage that may be provided safely to the RRH 24 without the threat of damage to the RRH 24 vary, typical values are a 38 Volt minimum DC power signal voltage and a 56 Volt maximum DC power signal voltage. Thus, the programmable power supply 28 may be designed to deliver a DC power signal having a relatively constant voltage that exceeds the nominal voltage, for example, about 54 or 52 Volts at the far end of the power cable 36 (i.e., about, 2-4 Volts less than the maximum DC power signal voltage for the RRH 24) in order to reduce the power loss associated with the voltage drop that the DC power signal experiences traversing the power cable 36.

The second power supply 28 may be configured to deliver a power signal to a remote RRH with reduced power loss. For example, the power supply 28 may comprise a programmable power supply that receives an input DC power signal from power supply 26 and outputs a DC power signal to the power cable 36. The voltage of the DC power signal output by the power supply 28 may vary in response to variations in the current of the DC power signal drawn from the power supply 28 by the RRH 24. In particular, the voltage of the DC power signal output by the power supply 28 may be set so that the voltage of the DC power signal at the far end of the power cable 36 (i.e., the end adjacent the RRH 24) is relatively constant. If the voltage of the DC power signal at the far end of power cable 36 is set to be approximately the maximum specified voltage for the power signal of the RRH 24, then the power loss associated with supplying the DC power signal to the RRH 24 over the power cable 36 may be reduced, since the higher DC power signal voltage will correspondingly reduce the current of the DC power signal that is supplied over the power cable 36.

Further details of providing a DC power signal voltage that may vary in response to variations in the current of the DC power signal drawn from the power supply 28 by the RRH 24 are provided in U.S. patent application Ser. Nos. 14/321,897 and 14/701,904, the entire contents of each of which are incorporated by reference herein.

Figure 3A:
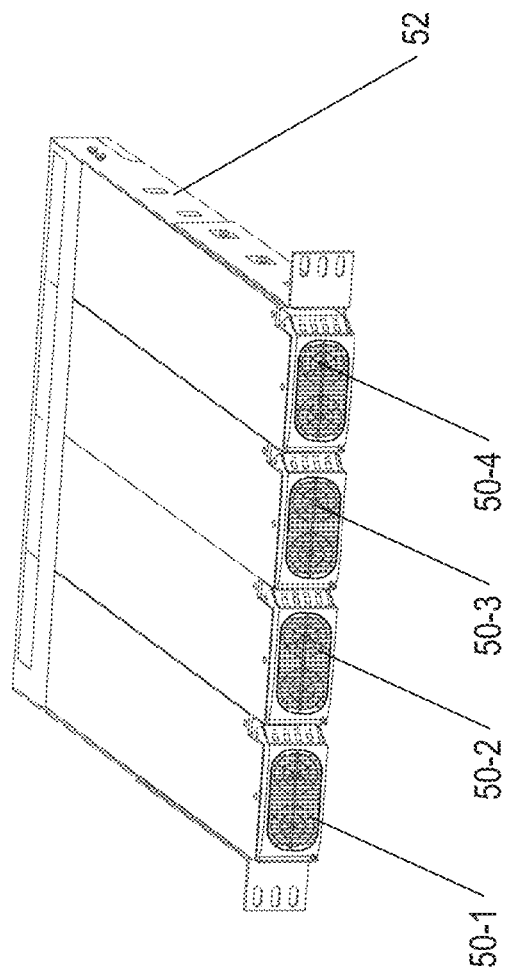
FIGS. 3A, 3B, and 3C are respectively a perspective front view, rear view, and simplified block diagram of some components of the power supply system of FIG. 2, according to an example embodiment.
Figure 3B:
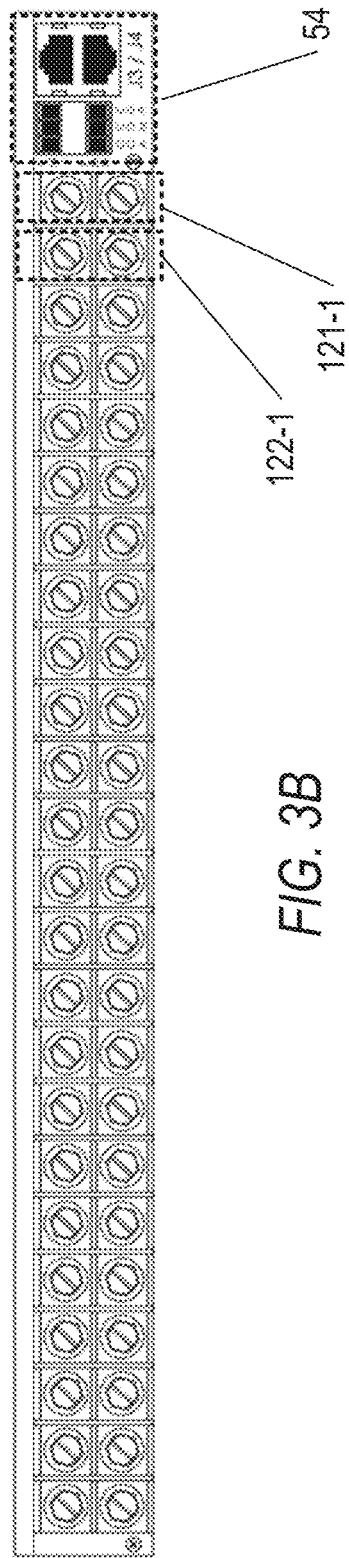
Figure 3C:
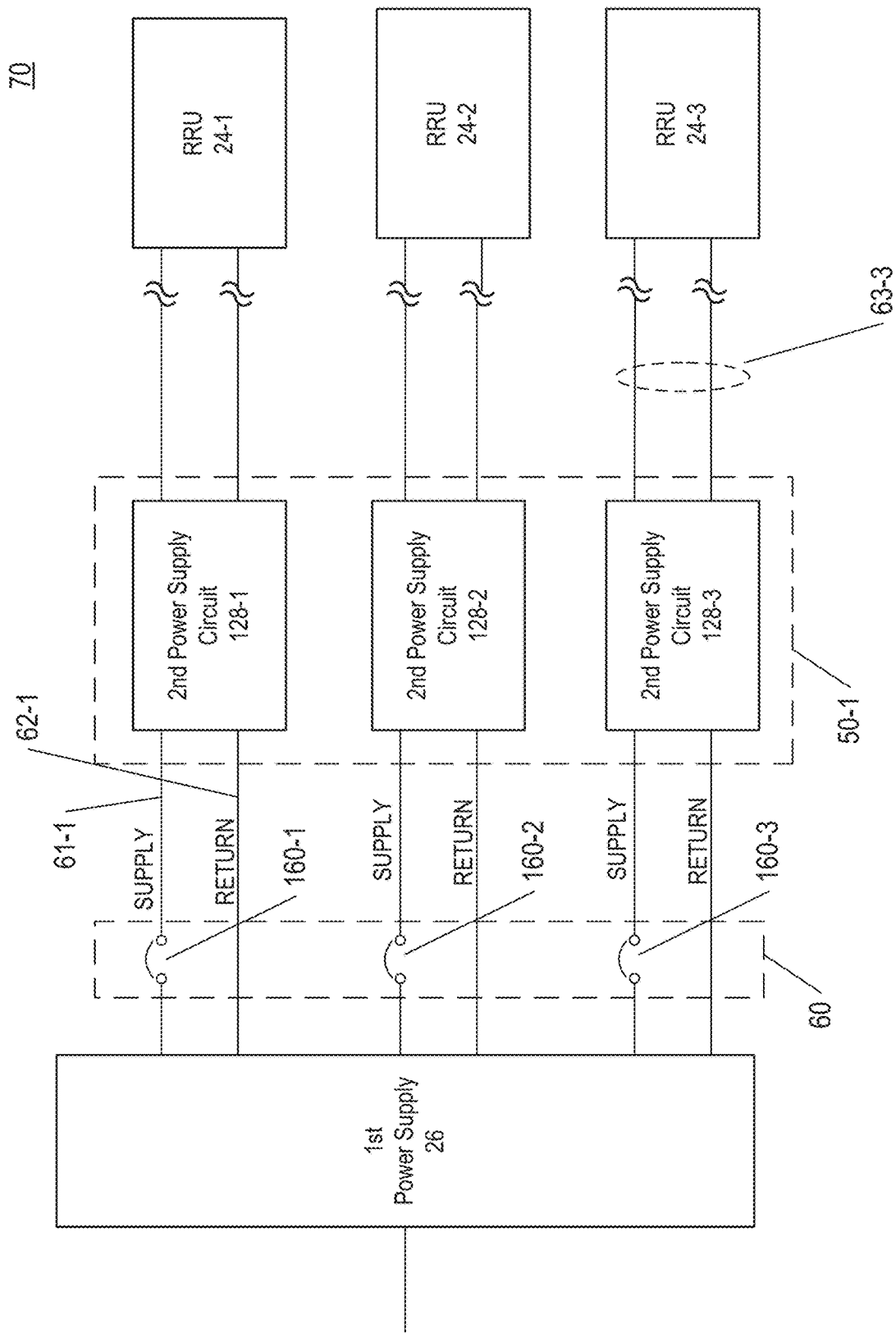

FIGS. 3A, 3B, and 3C are respectively a perspective front view, rear view, and simplified block diagram of some components of the power supply system of FIG. 2, according to an example embodiment. As best seen in FIG. 3A, a rack shelf 52 may include openings therein each configured to receive one of a plurality of modules 50 (e.g., module 50-1, 50-2, 50-3, or 50-4). The rack shelf 52 and the modules received therein may be one rack unit (1U, approximately 1.75 inches) in height, and the rack shelf 52 may be dimensioned in length and width to be received into a standard frame within an electrical enclosure (e.g., enclosure 20 of FIG. 2). As best seen in simplified block diagram 70 of FIG. 3C, each module 50 (e.g., module 50-1 of FIG. 3C) may comprise a housing and one or more second power supply circuits 128 therein (i.e., second power supply circuit 128-1, second power supply circuit 128-2). Each of the second power supply circuits 128 may implement the second power supply 28 of FIG. 2. Each of the one or more second power supply circuits 128 is electrically coupled to a first power supply 26 via an unganged (or independent) supply connection 61 via a first input 121 to the power supply circuit 128 and to a return connection 62 via a second input 121 to the power supply circuit 128. Each of the one or more second power supply circuits 128 is electrically coupled to a respective remote radio head 24 (i.e., remote radio head 24-1, remote radio head 24-2) via cabling connections 63 that terminate at first and second outputs 122 from the power supply circuit 128. As best seen in FIG. 3B, each second power supply circuit 128 may have a first pair of inputs 121 and a first pair of outputs 122 on the rear of the rack shelf 52. As seen in FIG. 3C, in some embodiments there may be three second power supply circuits 128 within the housing of each module 50, although example embodiments are not limited thereto. Thus, in the example of FIGS. 3A-C, for each module 50 there may be three pairs of inputs (i.e., six input connections) and three pairs of outputs (i.e., six output connections). Altogether for the four module rack shelf shown in FIGS. 3A-C, there may be forty-eight power connections, as the four modules have three second power supply circuits 128 each, and each second power supply circuit 128 has two inputs and two outputs (4*3*(2+2)=48). Each input and each output may have separate cable or cabling connection that terminates at the input or output, resulting in at least forty-eight cables terminating at the rack shelf 52. The supply connection 61 of each second power supply circuit 128 may include a respective breaker 160 (i.e., breaker 160-1, breaker 160-2), which may be in a separate rack-mounted power distribution box 60, adding additional cabling within the enclosure 20. Further cabling may be included to communicate with the modules 50 installed in the rack shelf 52 via communications section 54 (see FIG. 3B) which may include alarm contacts and/or one or more communications ports.

Figure 4A:
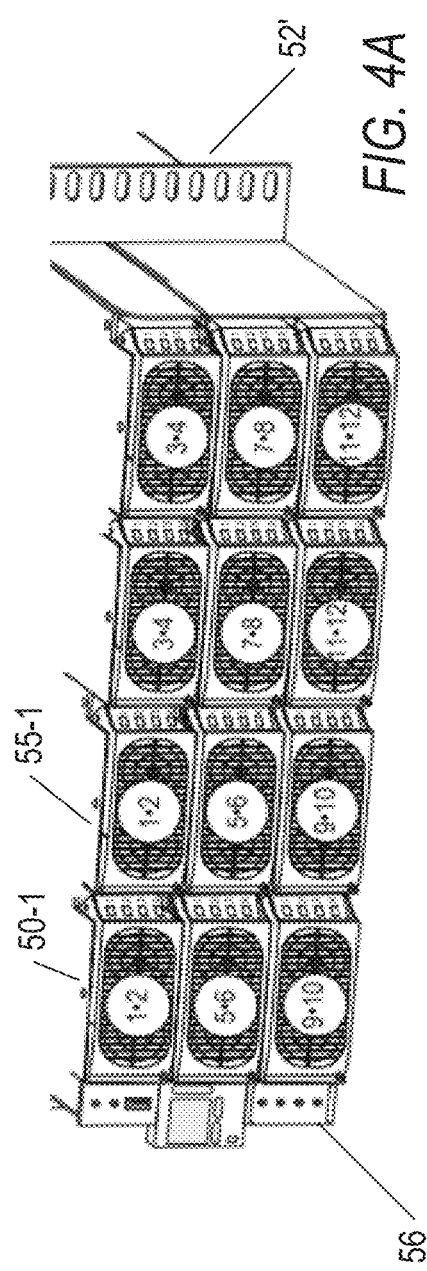
FIGS. 4A, 4B, and 4C are respectively a perspective front view, rear view, and simplified block diagram of some components of the power supply system of FIG. 2, according to an example embodiment.
Figure 4B:
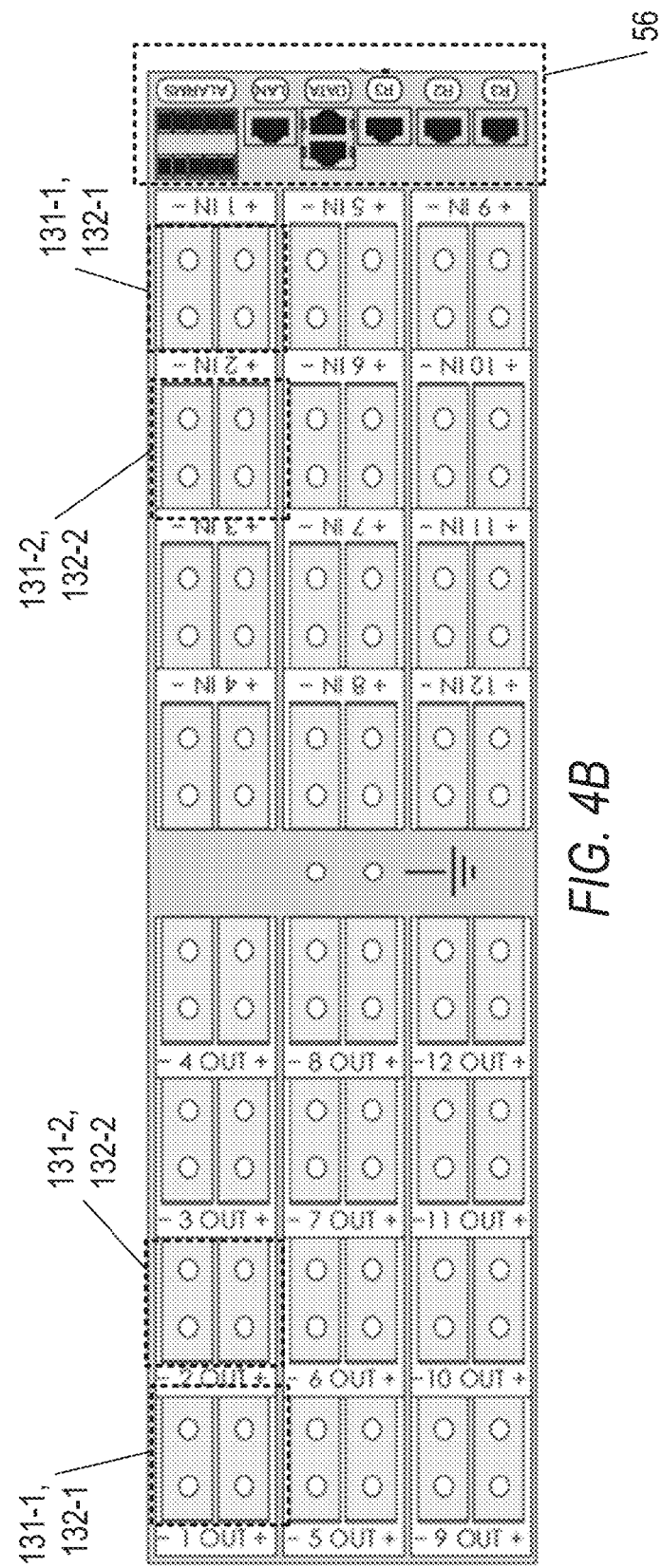
Figure 4C:
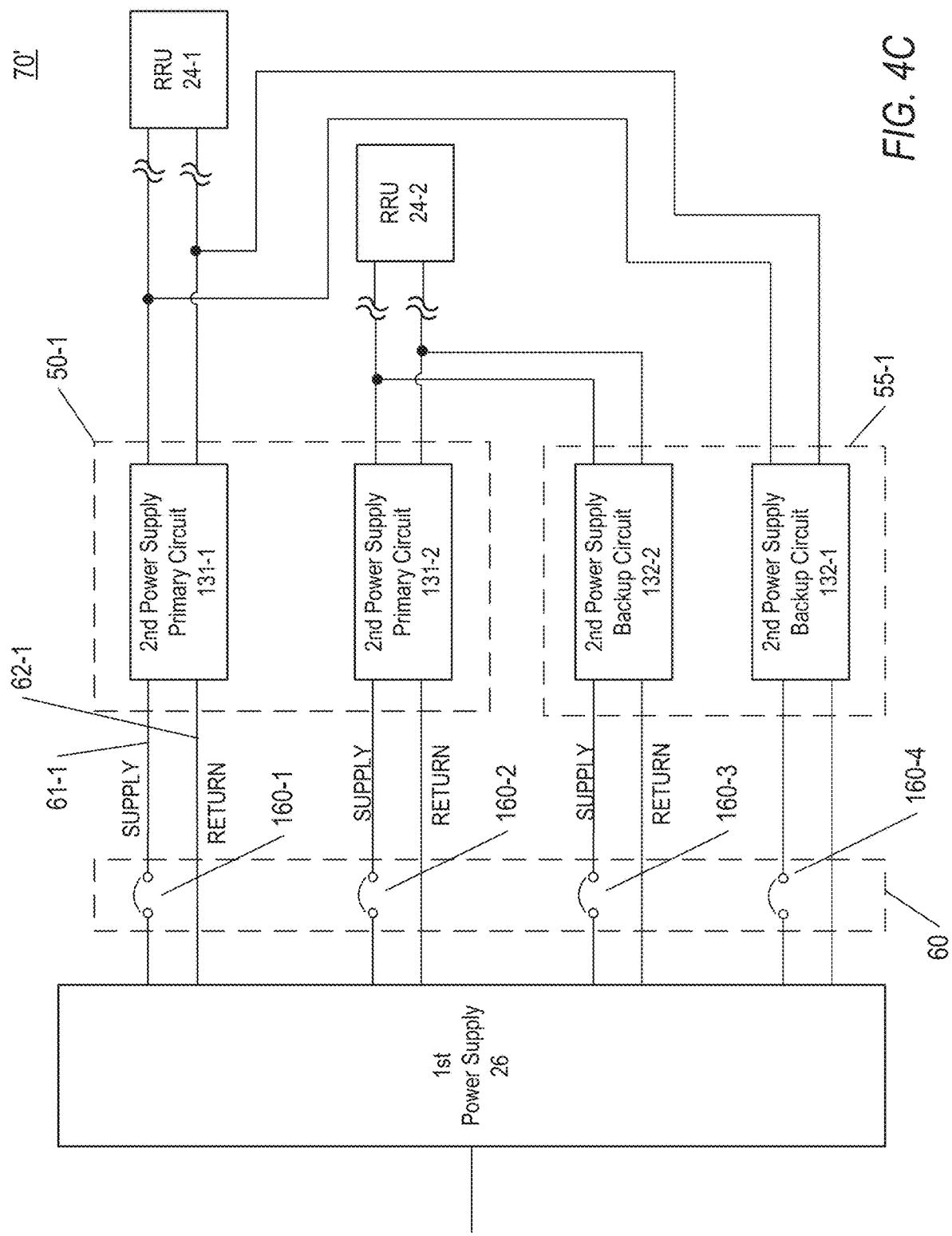

FIGS. 4A, 4B, and 4C are respectively a perspective front view, rear view, and simplified block diagram of some components of the power supply system of FIG. 2, according to example embodiments. FIG. 4A shows a three rack unit (3RU) rack shelf 52' that is configured to receive one or more primary modules 50 and one or more backup modules 55. As shown in FIG. 4A, up to six primary modules 50 may be included, and up to six backup modules 55 may be included. Each of the primary modules 50 may include two second power supply primary circuits 131 (e.g., first second power supply primary circuit 131-1, second second power supply primary circuit 131-2), and each of the backup modules 55 may include two second power supply backup circuits 132 (e.g., first second power supply backup circuit 132-1, second second power supply backup circuit 132-2). Each of the second power supply primary circuits 131 and second power supply backup circuits 132 may implement the second power supply 28 of FIG. 2, and the second power supply backup circuits 132 may be provided for redundancy purposes. Accordingly, as best seen in FIG. 4C in block diagram 70', each of the modules 50 may provide primary power to first and second remote radio heads 24, and each of the backup modules 55 may provide backup power to the same first and second remote radio heads 24. As in the example of FIG. 3A-3C, and as seen in FIG. 4C, each second power supply primary circuit 131 and second power supply backup circuit 132 may have two inputs from the first power supply 26 (supply input 61 and return input 62), and may provide two outputs to the remote radio head 24. Because each second power supply primary circuit 131 has a corresponding second power supply backup circuit 132 for redundancy, the supply inputs to a second power supply primary circuit 131 and its respective second power supply backup circuit 132 may be ganged together, e.g., using two hole lugs, and the return inputs, supply outputs, and return outputs may be similarly joined. Even with such ganging, there are still approximately forty-eight cabling connections to be made in the rear of rack shelf 52'. In some embodiments, the supply connection of each second power supply primary circuit 131 and/or each second power supply backup circuit 132 may include a respective breaker 160 (i.e., breaker 160-1, breaker 160-2), which may be in a separate power distribution box 60. Further cabling may be included to communicate with the modules 50 installed in the rack shelf 52' via communications section 56, which may include alarm contacts, a controller, and/or one or more communications ports.

It is recognized that the systems and block diagrams of FIGS. 3A-3C and 4A-4C may require significant cabling requirements. It is also recognized that space within electrical enclosures, such as enclosure 20 of FIG. 2, is at an increasing premium, as it may be desirable to locate additional components within an enclosure 20 to provide improved reliability, throughput, or features in communications handled by the cell site. Furthermore, in some enclosures 20, access to locations within the enclosure 20 may be limited, increasing the difficulty of installation of the rack shelves of FIGS. 3A and 4A and the modules therein, and later adjustments thereto.

Figure 5A:
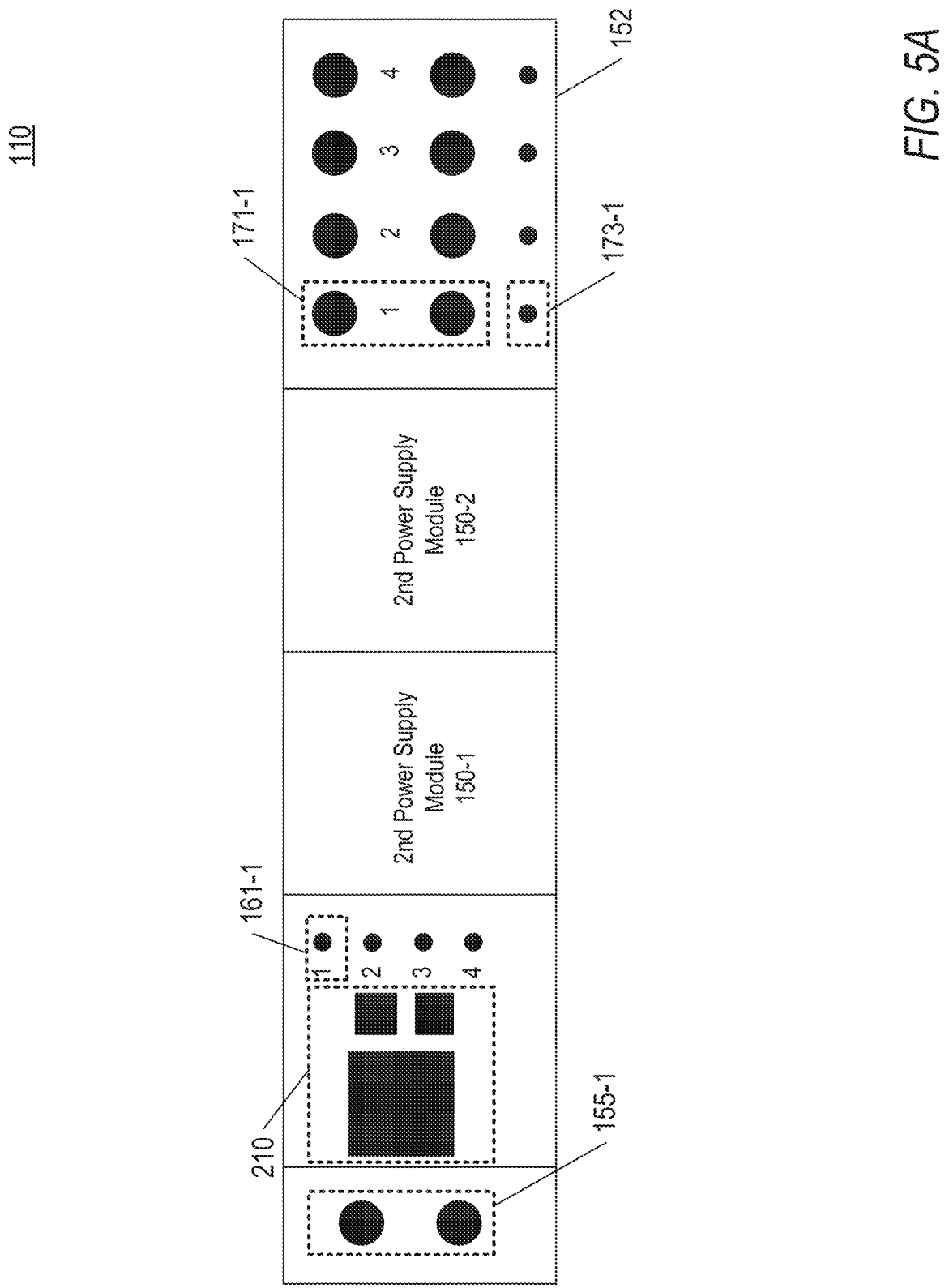
FIGS. 5A and 5B respectively illustrate front views of one rack shelf and three rack shelves of some components of the power supply system of FIG. 2, according to example embodiments.
Figure 5B:
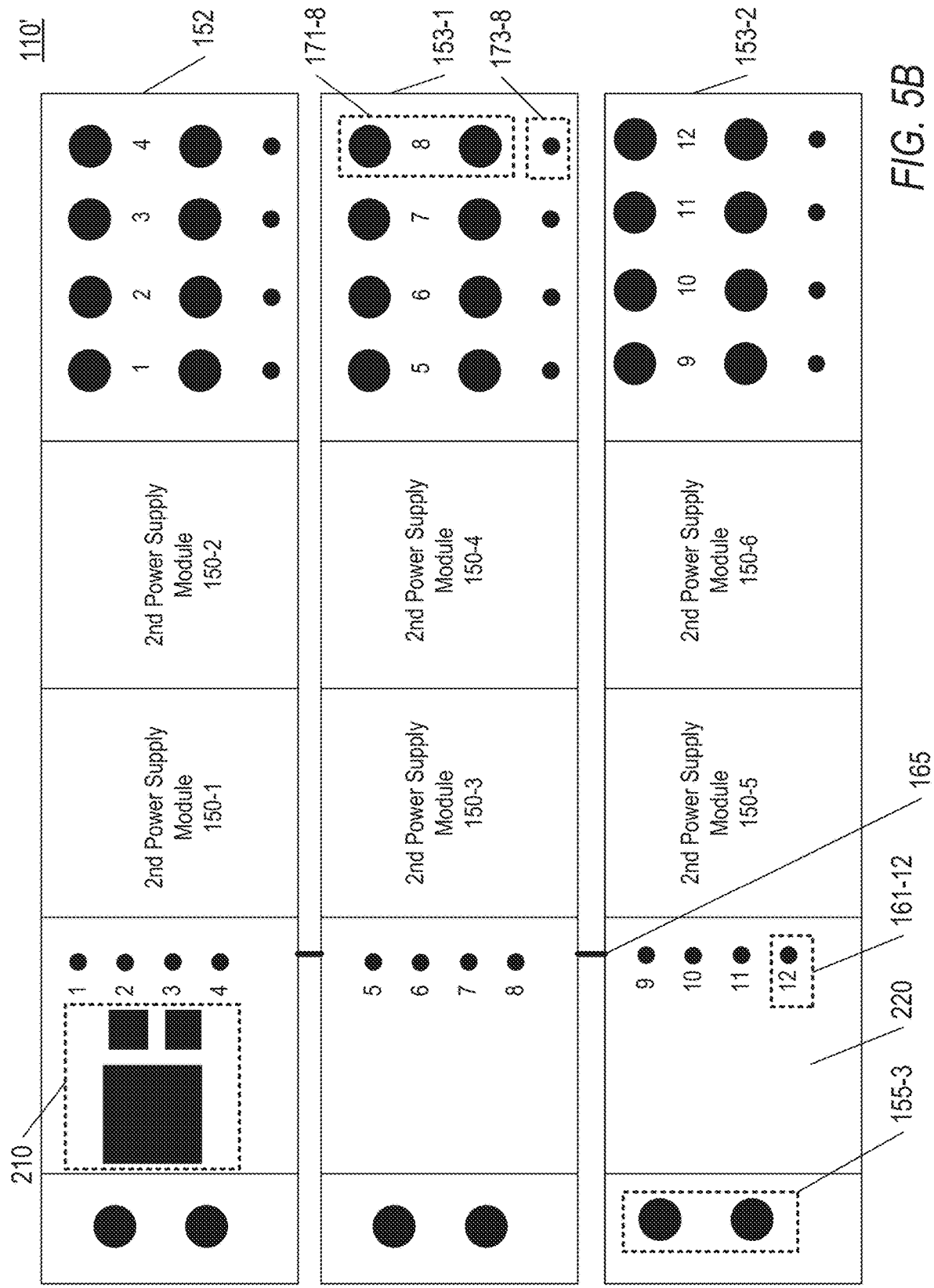

FIGS. 5A and 5B respectively illustrate front views of one rack shelf and three rack shelves of certain components of the power supply system of FIG. 2, according to example embodiments. In FIG. 5A, a power supply component 110 may include one or more power supply modules 150, which may each include one or more second power supply circuits (not shown in FIG. 5A) that implement the second power supply 28 of FIG. 2. In the example of FIG. 5A, two power supply modules 150 are shown, and each power supply module 150 includes two second power supply circuits. The resultant four second power supply circuits respectively power four RRHs 24 (not shown in FIG. 5A). Supply inputs to the power supply circuits of the power supply component 110 may be ganged together, and return inputs to the power supply circuits of the power supply component 110 may be also ganged together. Thus, there may be only two inputs 155-1 to the power supply component 110, namely one supply input and one return input. Each power supply circuit may have two outputs 171 (a supply output and a return output), and thus in the example of FIG. 5A eight outputs are provided. The inputs 155-1 and outputs 171 may be available from a front side of a rack shelf 152 into which the power supply modules 150 are installable.

The power supply modules 150 may be controllable via a controller 210, which may be in some embodiments an edge controller. Further, in line (i.e., electrically in series) with each supply output of each power supply circuit and within the power supply module 150 may be an output toggle (not shown in FIG. 5A), which may be controllable either by the controller 210 and/or by a separate hardware input control 161. A plurality of input controls 161 may be present, each respectively controlling an output toggle. For example, a first input control 161-1 may control an output toggle coupled to a first second power supply circuit within power supply module 150-1. A status indicator or light emitting diode 173 may be present to visually indicate the connection status of each output 171 within the power supply component 110.

FIG. 5B illustrates power supply component 110', in which three one-unit rack shelves 152, 153-1, and 153-4 may be may be present in a power supply system. In some embodiments, instead of the three one-unit rack shelves, one three-unit rack shelf may be used, or a two-unit rack shelf with a one-unit rack shelf may be used. The first rack shelf 152 of FIG. 5B may be similar to the rack shelf 152 of FIG. 5A. The second rack shelf 153-1 and third rack shelf 153-2 may be similar to the rack shelf 152 of FIG. 5A as well, except that controller 210 may be omitted from the second rack shelf 153-1 and third rack shelf 153-2, which instead may include a blank panel 220 and/or a panel 220 including input controls 161 similar to those described above. A bus or communications link 165 may be present and may allow for control of the modules 150 installed within the second rack shelf 153-1 and/or third rack shelf 153-2 by the controller 210 in the first rack shelf 152. The number of racks, rack shelves, modules, inputs, and outputs are all examples, and it is within the scope of the present disclosure that any number of racks, rack shelves, modules, inputs, and/or outputs may be present within a power supply system according to the present disclosure. Further, although all inputs and all outputs are shown on a front surface of the rack shelves 152, 153-1, and 153-2, in some embodiments, portions of inputs and outputs may be located elsewhere (e.g., on a back surface thereof).

Figure 6:
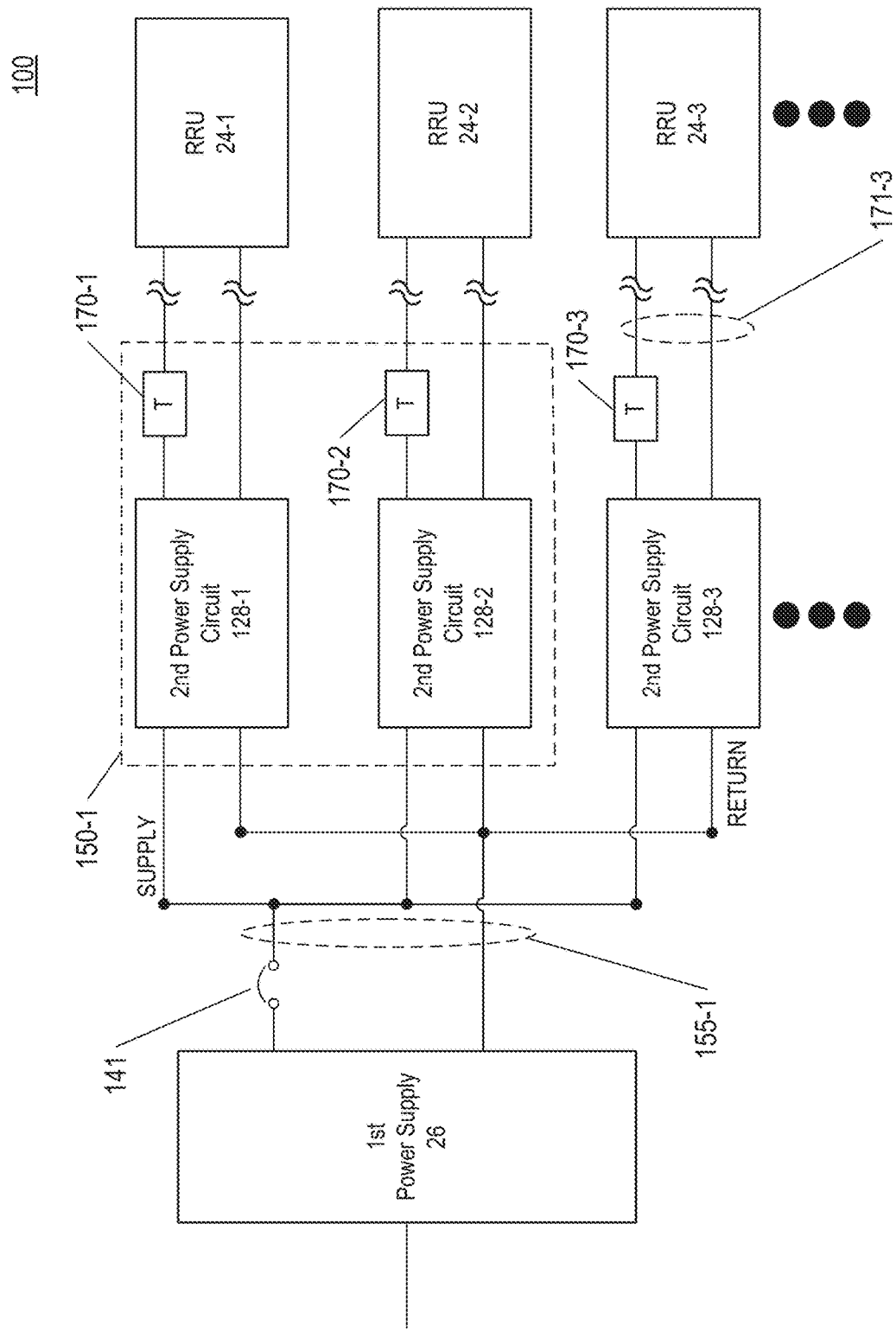
FIG. 6 is a simplified block diagram of components within a rack shelf of FIG. 5A or 5B, according to example embodiments.

FIG. 6 is a simplified block diagram 100 of certain components within a rack shelf (e.g., rack shelf 152) of FIG. 5A or 5B, according to example embodiments. In the example of FIG. 6, a first power supply module 150-1 is shown that includes two second power supply circuits 128-1 and 128-2. A third second power supply circuit 128-3 is also shown, which may be located within a housing of a different module (in the example of FIG. 6), but may be part of the first power supply module 150-1 in some embodiments. Each second power supply circuit 128-1, 128-2, 128-3 powers a respective RRH 24 via respective outputs 171. An output toggle 170 may be electrically coupled between each second power supply circuit 128 and the respective RRH 24 powered thereby. Each output toggle 170 may be controlled by, e.g., an input control 161 (e.g., switch, push-button, or the like) on the rack shelf 152, 153-1, or 153-2. For example, each output toggle 170 may be implemented as a switch, FET, relay, circuit breaker, or other controlled or controllable switching device. As seen in FIG. 6, supply inputs to the second power supply circuits 128-1, 128-2, 128-3 may be ganged together, and return inputs to the power supply circuits 128-1, 128-2, 128-3 of the power supply component 110 may be also ganged together. An input breaker 141 that is common to each of the supply inputs to the second power supply circuits 128-1, 128-2, 128-3 may be provided. Thus, providing or disabling power to each RRH 24 may be controlled by operation of the respective output toggle 170, or controlled in common by the input breaker 141. In this way, power may be removed from a portion of the RRHs 24, for example to permit maintenance or operation on a portion of the cell site, without completely disabling the cell site.

Figure 7:
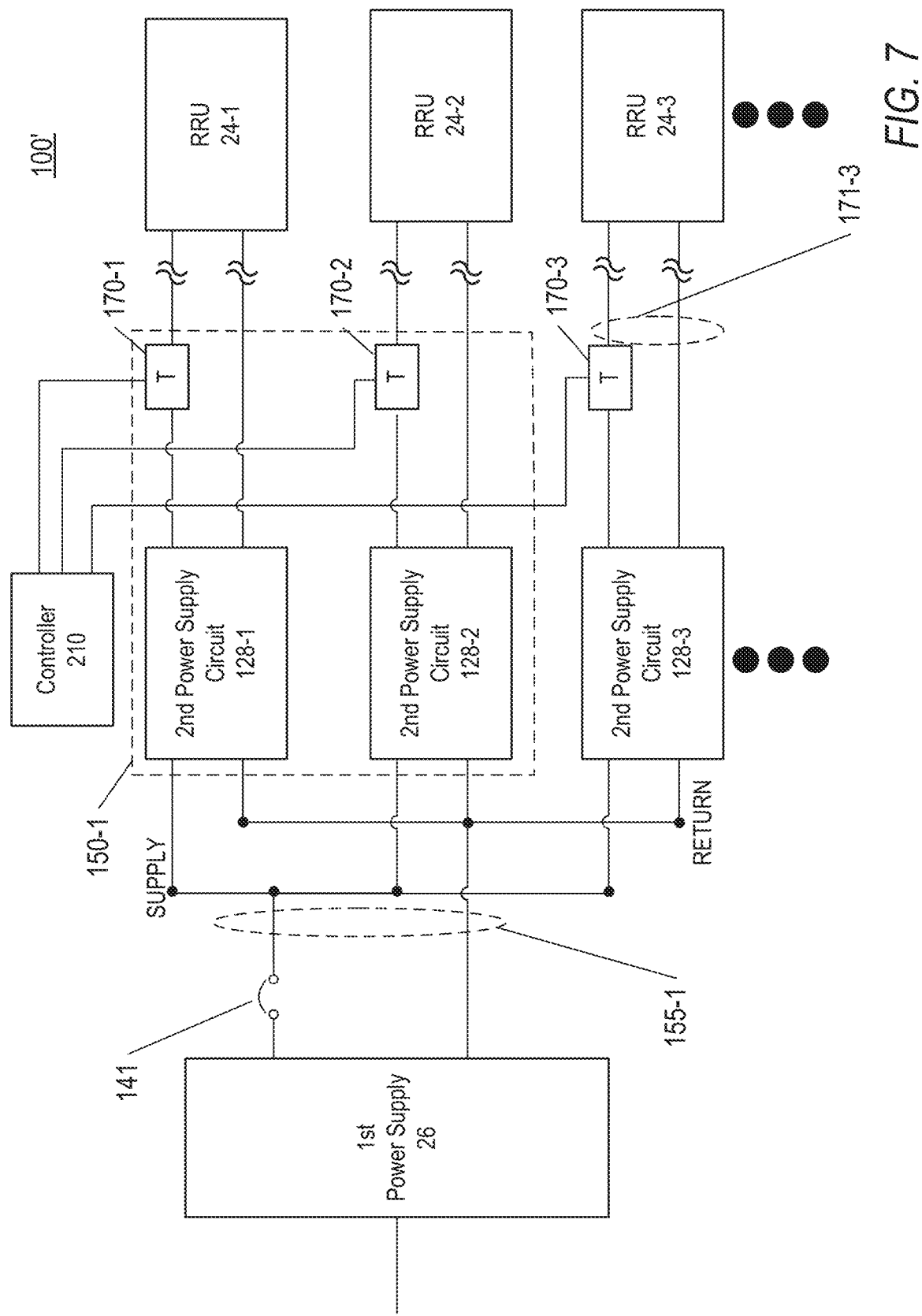
FIG. 7 is a simplified block diagram of components within a rack shelf of FIG. 5A or 5B, according to example embodiments.

FIG. 7 is a simplified block diagram 100' of certain components within a rack shelf of FIG. 5A or 5B, according to example embodiments. FIG. 7 is similar to FIG. 6, except that the output toggle 170 may be controlled via the controller 210, for example using a combination of hardware, software, and/or firmware elements. For example, the controller 210 may include a processor and memory storing non-transitory computer readable instructions that are executable by the processor. Such instructions may include instructions that, when executed by the processor, cause the processor to open one or more of the output toggle 170 responsive to an input. The input may include user input in some embodiments.

Figure 8:
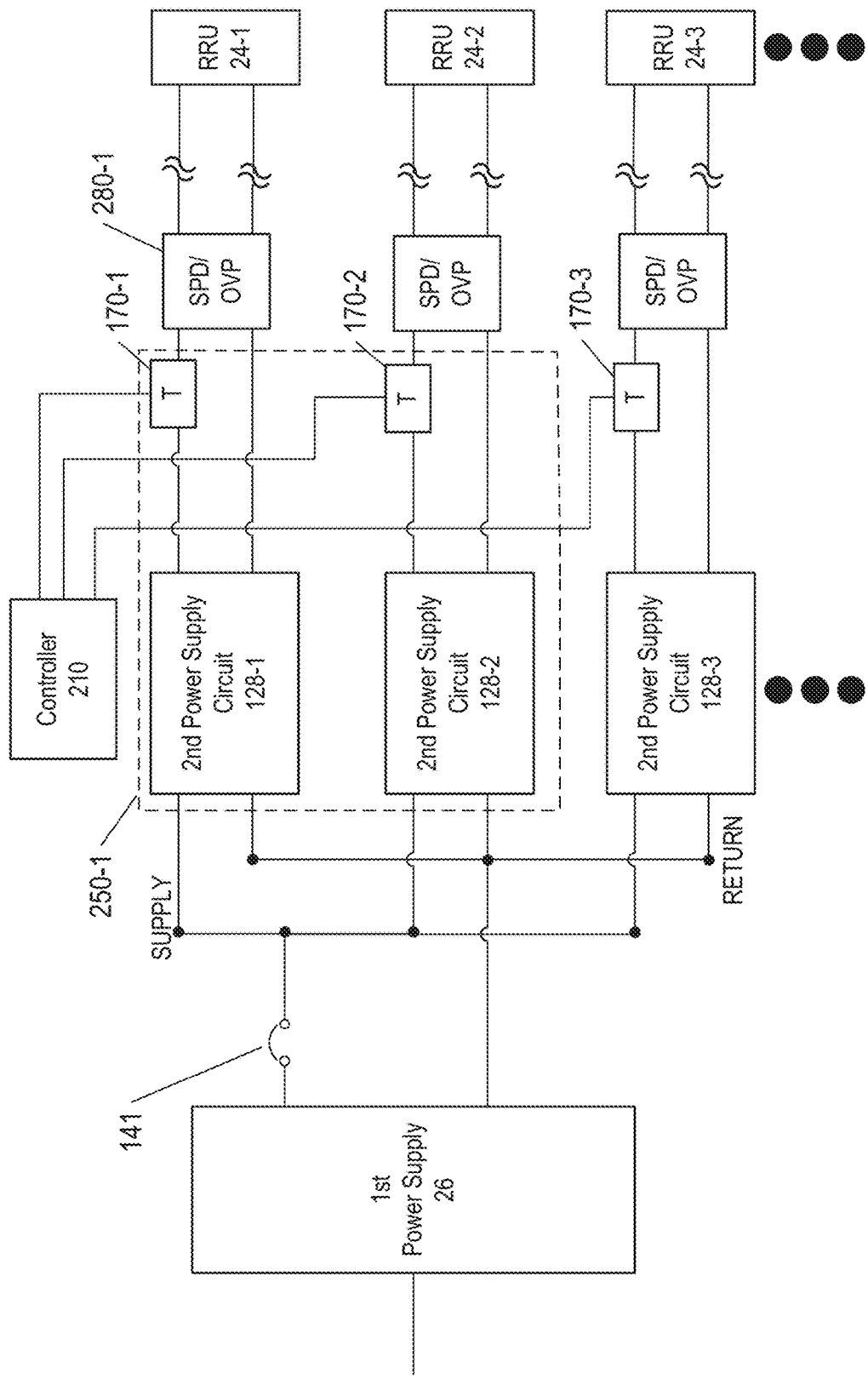
FIG. 8 is a simplified block diagram of components within a rack shelf of FIG. 5A or 5B, according to example embodiments.

FIG. 8 is a simplified block diagram of components within a rack shelf of FIG. 5A or 5B, according to example embodiments. FIG. 8 is similar to FIG. 7, except that in the simplified block diagram 200 of FIG. 8, each second power supply circuit 128 and each output toggle 170 is protected by a respective surge protection device or overvoltage protection device (SPD/OVP) 280. In some embodiments, the SPD/OVP 280 may be located within the housing of a module 250 that includes the second power supply circuit(s) 128. In some embodiments, as illustrated in FIG. 8, the SPD/OVP 280 may be located outside of the module 250, and may be located elsewhere within the rack shelf 52 configured to receive the module 250, elsewhere within the electrical enclosure 20, and/or elsewhere in the system of FIG. 2. The aspects discussed with reference to the block diagram 200 of FIG. 8 are compatible with those of the block diagram 100 of FIG. 6, and are presented separately herein for ease of convenience in describing both.

Figure 9:
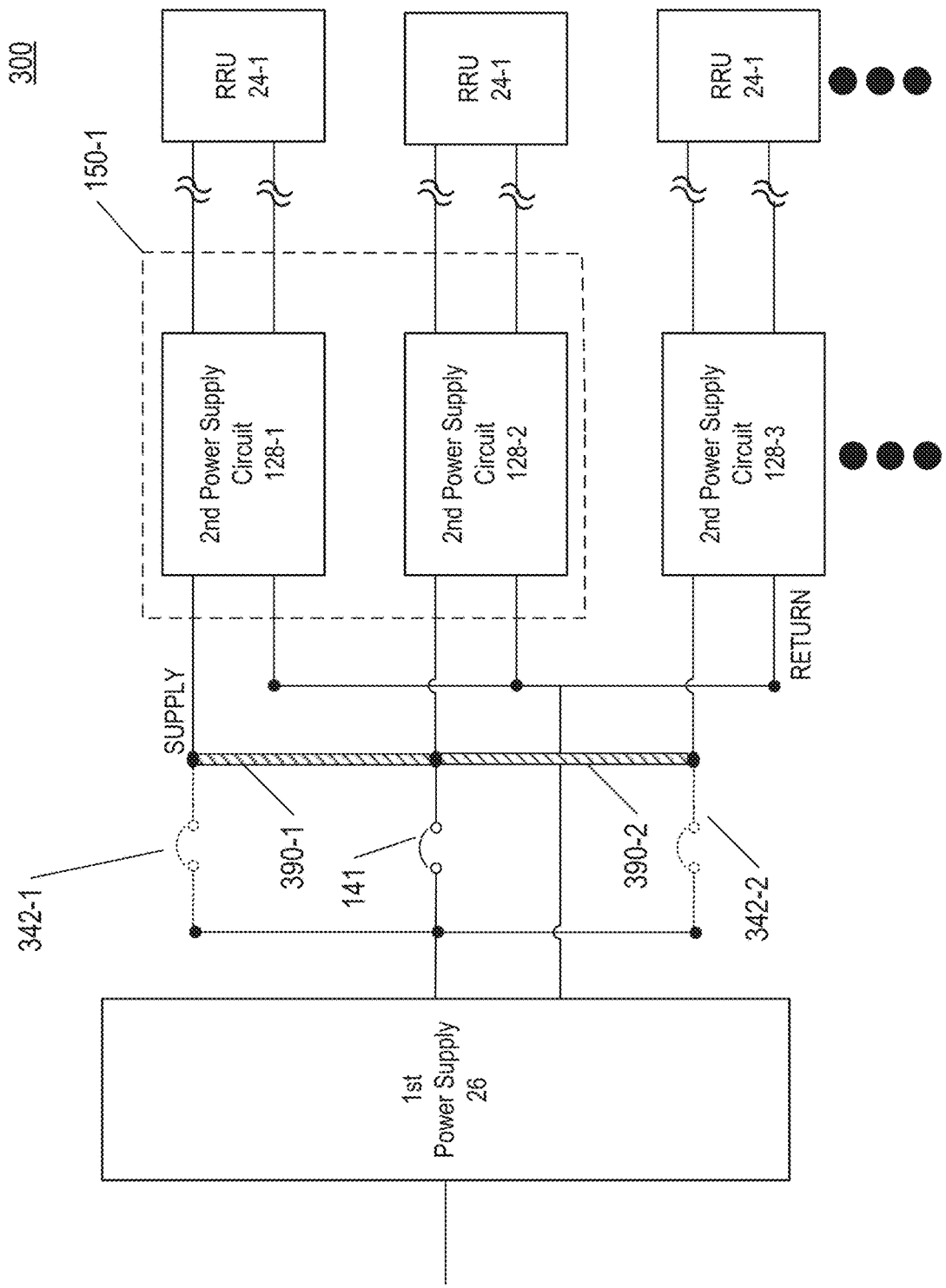
FIG. 9 is a simplified block diagram of components within a rack shelf of FIG. 5A or 5B, according to example embodiments.

FIG. 9 is a simplified block diagram 300 of components within a rack shelf of FIG. 5A or 5B, according to example embodiments. In FIG. 9, the ganged nature of the supply inputs to the power supply modules 150 and/or the second power supply circuits 128 therein may be field-adjustable. For example, an input breaker 141 (which may be located in a power distribution box not shown in FIG. 9) may be configured to supply power to one or more second power supply circuits 128 via field-removable bars 390 (e.g., first bar 390-1, second bar 390-2). In some embodiments, the field-removable bars 390 may be located on an exterior of the rack shelf 52 and may electrically couple inputs to each second power supply circuit 128 together. A field technician operating or installing equipment at a cell site may remove the field-removable bars 390 from the inputs, thereby removing the electrical coupling therebetween. Additional input breakers 342 (342-1, 342-2) may be provided within the power distribution box, and respective supply inputs may be provided to each second power supply circuit 128. In some embodiments, as there is an input breaker 141 or 342 for each second power supply circuit 128, the output breakers 170 of FIGS. 6 and 7 may be optional and omitted. However, in some embodiments, the output breakers 170 of FIGS. 6 and 7 may be present; further, in some embodiments, the output breakers 170 of FIGS. 6 and 7 may be controlled in any manner discussed above, or control thereof may be disabled (e.g., by appropriate operation of the controller 210). Further, surge protection devices and/or overvoltage protection devices such as those discussed with reference to FIG. 8 may be present or absent in embodiments implementing block diagram 300 of FIG. 9.

Figure 10:
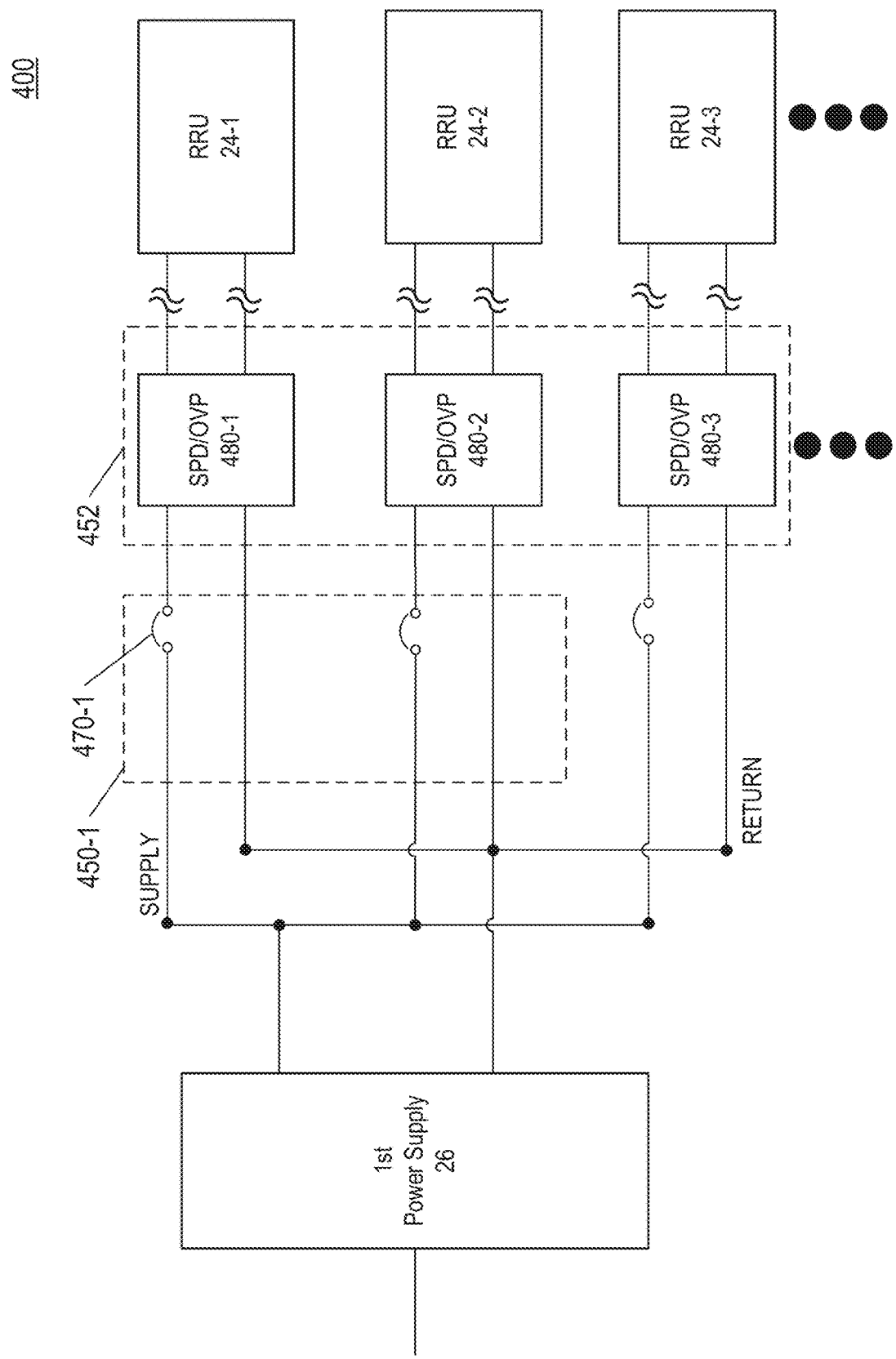
FIG. 10 is a simplified block diagram of components within a rack shelf of FIG. 5A or 5B, according to example embodiments.

FIG. 10 is a simplified block diagram 400 of components within a rack shelf of FIG. 5A or 5B, according to example embodiments. In some embodiments, a dummy module 450 may be used in place of a module 150 that includes a second power supply circuit 128. The dummy module 450 may include connections (e.g., wiring) that complete a circuit between the first power supply 26 and/or the input breaker 141 and a surge protection device and/or overvoltage protection device (SPD/OVP) 480. Also present within the dummy module 450 may an output breaker 470 for each RRH 24, which are similar to the output breakers 170 discussed above. Although the SPD/OVP devices 480 are shown within rack shelf 452, it is contemplated that in some embodiments the SPD/OVP devices 480 may be located within the dummy module 450.

The dummy module 450 may be used in situations where varying in response to variations in the current of the DC power signal drawn from the power supply 26 by the RRH 24 are not needed, such as where cell traffic is relatively low. In such situations, the operator of the cell traffic may elect to install a dummy module 450 initially, and then replace the dummy module 450 with a module 150 at a later time when cell traffic increases. This module swapping may be advantageous, as it may be performed without complete replacement of the rack shelf 52/452 into which the dummy module 150 is installable. The aspects discussed with reference to the block diagram 400 of FIG. 10 are compatible with those of the block diagram 100 of FIG. 6, and with block diagram 100' of FIG. 7, and are presented separately herein for ease of convenience in describing the various aspects of the present disclosure. Thus, in some embodiments, dummy modules 450 may be used with the controller 210 of FIG. 7, or with the switches of FIG. 6.

Figure 11:
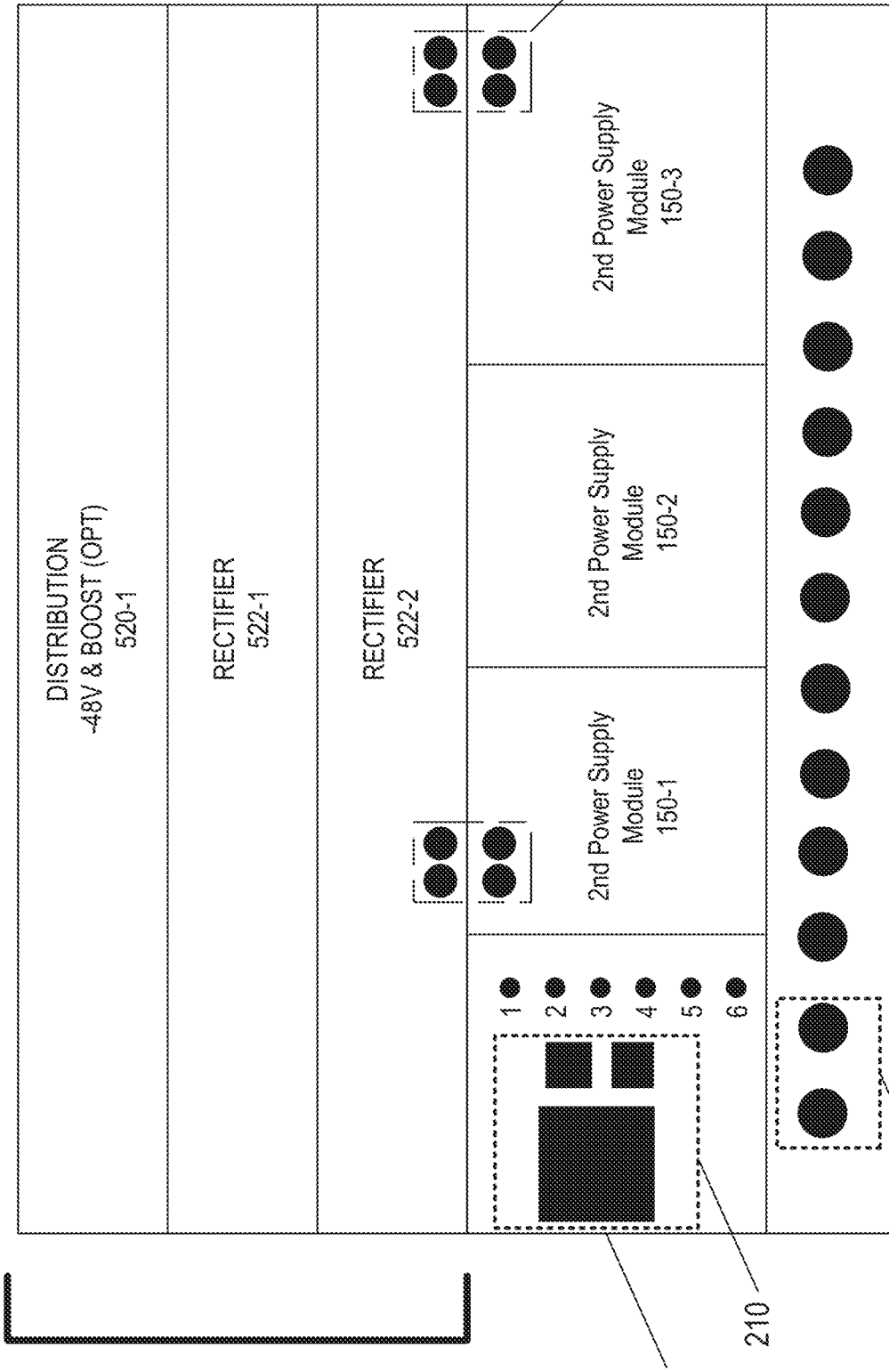
FIG. 11 illustrates front views of an arrangement of components of the power supply system of FIG. 2, according to example embodiments.

FIG. 11 illustrates front views of an arrangement of components of the power supply system of FIG. 2, according to some example embodiments. As seen in FIG. 11, a power supply component 510 may include the first power supply 26, which may be several rack units (RU) in height, and may include one or more components such as a voltage transformer (not shown), a power distribution box 520-1 that may include the voltage transformer and one or more rectifiers 522 (e.g., a first rectifier 522-1, a second rectifier 522-2). A rack shelf 552 including a plurality of second power supply modules 150, may be installed directly below the components of the first power supply 26. Each of the components of the first power supply 26 may be coupled electrically together using a busbar (not shown in FIG. 11). The busbar may be, for example, at a rear of a rack shelf in which the components of the first power supply 26 are installed. As illustrated in FIG. 11, the busbar may be extended or supplemented with one or more busbar extensions 555, which may couple the second power supply modules 150 to a component of the first power supply 26 that is configured to provide an input to the second power supply modules 150. Such an arrangement may reduce the amount of cabling required, and may permit a non-cabling connection between the second power supply 28 of FIG. 2 and the first power supply 26 and/or components thereof. Such an arrangement may also have space advantages and permit a greater number of second power supply modules 150 to be located in the rack shelf 552. In some embodiments, the inputs to the power supply modules 150 of FIG. 11 may be ganged together, although in some embodiments, a plurality of busbars or busbar extensions 555 may be provided that respectively correspond to the modules in the rack shelf 552. In some embodiments, outputs 171 from the second power supply modules 150 may be located below the second power supply modules 150 and the controller 210. Some of the aspects of power supply component 510 of FIG. 11, power supply component 110 of FIG. 5A, power supply component 110' of FIG. 5B, block diagram 100 of FIG. 6, block diagram 100' of FIG. 7, block diagram 200 of FIG. 8, block diagram 300 of FIG. 9, and block diagram 400 of FIG. 10 are not mutually exclusive, and are shown separately for ease of discussion. Therefore, at least some the shown aspects of the systems and block diagrams of FIGS. 5A-11 are combinable in some embodiments.

Aspects of the present disclosure have been provided herein with reference to the accompanying drawings, in which certain example embodiments of the inventive concepts are shown. These inventive concepts may, however, be embodied in many different forms and should not be construed as limited to the example embodiments that are pictured and described herein. These example embodiments are provided herein so that this disclosure will be thorough and complete, and will fully convey the scope of the inventive concepts to those skilled in the art. Like numbers refer to like elements throughout the specification and drawings, and repeated descriptions of the same may be omitted herein for brevity. It will also be appreciated that the example embodiments disclosed herein can be combined in any way and/or combination to provide many additional embodiments.

Although the terms first, second, etc. are used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Unless otherwise defined, all technical and scientific terms that are used in this disclosure have the same meaning as commonly understood by one of ordinary skill in the art to which this disclosure belongs. The terminology used in the above description is for the purpose of describing particular embodiments only and is not intended to be limiting of this disclosure. As used in this disclosure, the singular forms "a", "an" and "the" are intended to include the plural forms as well, unless the context clearly indicates otherwise. It will also be understood that when an element (e.g., a device, circuit, etc.) is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be further understood that the terms "comprises" "comprising," "includes" and/or "including" when used herein, specify the presence of stated features, operations, elements, and/or components, but do not preclude the presence or addition of one or more other features, operations, elements, components, and/or groups thereof.

In the drawings and specification, there have been disclosed typical example embodiments of the present inventive concepts and, although specific terms are employed, they are used in a generic and descriptive sense only and not for purposes of limitation, the scope of the inventive concepts being set forth in the following claims.

What is claimed is:

1. A power supply system comprising:
a first power supply installed in a rack;
a plurality of second power supplies, each second power supply in the plurality of second power supplies configured to be installed in a rack shelf next to the first power supply installed in the rack, wherein a plurality of busbar extensions separately couple each of the plurality of second power supplies to the first power supply, wherein each busbar extension in the plurality of busbar extensions is an additional busbar to a busbar that couples components on the first power supply to one another, wherein each of the plurality of second power supplies is configured to receive a first power signal from the first power supply and provide a second power signal to a respective radio from a plurality of radios, wherein the radio is located outside the rack.

2. The power supply system of claim 1, wherein the power supply system further comprising a module having a housing that comprises the plurality of second power supplies wherein the module is configured to be installed in a rack.

3. The power supply system of claim 2, wherein the module further comprises a plurality of output breakers, with ones of the plurality of output breakers electrically coupled between each second power supply and the respective radio.

4. The power supply system of claim 3, wherein the output breakers are each controlled by a respective toggle or switch located on a front panel of the rack shelf.

5. The power supply system of claim 3, wherein the output breakers are controlled by a controller configured to receive input.

6. The power supply system of claim 1, wherein the at least first inputs to each of the plurality of second power supplies are ganged together by a removable bar, and wherein removal of the removable bar results in each of the second power supplies being independently electrically coupled to the first power supply.

7. The power supply system of claim 1, wherein each second power supply comprises a surge protection device or overvoltage protection device.

8. The power supply system of claim 7, wherein each of the surge protection device or the overvoltage protection device is configured to protect a component within the respective second power supply from an overvoltage on an output from the second power supply.

9. The power supply system of claim 1, wherein the first power signal is the same as the second power signal.

10. The power supply system of claim 1, wherein the at least first inputs are provided on a front surface of a panel on the rack shelf.

11. The power supply system of claim 1, wherein outputs from each second power supply are provided on a front surface of a panel on the rack shelf.

12. The power supply system of claim 1, wherein each of the plurality of second power supplies is configured to adjust a voltage level of the second power signal such that the voltage at a radio end of a cabling connection between the second power supply and the respective radio is substantially constant notwithstanding variation in a current level of the second power signal.

13. The power supply system of claim 1, further comprising an input breaker electrically coupled between the first power supply and the plurality of second power supplies.

14. The power supply system of claim 1, wherein the first power supply is installed at a first location in a rack, wherein the rack shelf is installed at a second location in the rack below the first location, and wherein the plurality of second power supplies are electrically coupled to the first power supply via a busbar or busbar extension.

15. A telecommunications system comprising:
a plurality of remote radio heads outside a rack; and
a plurality of second power supplies, each second power supply in the plurality of second power supplies configured to be installed in a rack shelf in the rack, wherein each of the plurality of second power supplies is configured to receive a first power signal from the first power supply and provide a second power signal to a respective radio from the plurality of radios, and wherein at least first inputs to each of the plurality of second power supplies are ganged together;
a plurality of output breakers, wherein each output breaker is electrically coupled between a respective second power supply of the plurality of second power supplies and the respective radio, wherein the output breakers are each controlled by a respective toggle or switch, wherein the respective toggle or switch is located on a front panel of the rack shelf; and
a controller configured to control the respective toggle or switch for the output breakers in response to an input.

16. The telecommunications system of claim 15, wherein the input provided to the controller is located at at least one of:
a location on a front panel of the rack shelf, and
remote from the location of the rack shelf.

17. A power supply system comprising:
a plurality of second power supplies, each second power supply in the plurality of second power supplies configured to be installed in a rack shelf next to a first power supply installed in the rack shelf, wherein a busbar extension separately couples the plurality of second power supplies to the first power supply, wherein the busbar extension is an additional busbar to a busbar that couples components on the first power supply to one another, wherein each of the plurality of second power supplies is configured to receive a first power signal from the first power supply and provide a second power signal to a respective radio from a plurality of radios; and
a plurality of output breakers, wherein each output breaker is electrically coupled between a respective second power supply of the plurality of second power supplies and the respective radio, wherein the output breakers are each controlled by a respective toggle or switch; and
a controller configured to control the respective toggle or switch for the output breakers in response to an input.

18. The power supply system of claim 17, wherein the inputs to each of the plurality of second power supplies are provided on a front surface of a panel on the rack shelf.

19. The power supply system of claim 18, wherein outputs from each second power supply are also provided on the front surface of the panel on the rack shelf.

* * * * *